United States Patent
Lee et al.

(10) Patent No.: US 11,038,503 B2
(45) Date of Patent: Jun. 15, 2021

(54) GAN DRIVER USING ACTIVE PRE-DRIVER WITH FEEDBACK

(71) Applicant: Efficient Power Conversion Corporation, El Segundo, CA (US)

(72) Inventors: Edward Lee, Fullerton, CA (US); Ravi Ananth, Laguna Niguel, CA (US); Michael Chapman, Long Beach, CA (US); Michael A. de Rooij, Playa Vista, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/553,650

(22) Filed: Aug. 28, 2019

(65) Prior Publication Data
US 2020/0076426 A1 Mar. 5, 2020

Related U.S. Application Data

(60) Provisional application No. 62/723,801, filed on Aug. 28, 2018.

(51) Int. Cl.
*H03K 17/687* (2006.01)
(52) U.S. Cl.
CPC .............................. *H03K 17/6871* (2013.01)
(58) Field of Classification Search
CPC ............. H03K 17/00; H03K 17/04126; H03K 17/063; H03K 17/0826; H03K 17/601; H03K 17/6871; H03K 2217/00; H03K 2217/0036
See application file for complete search history.

(56) References Cited

U.S. PATENT DOCUMENTS

| 5,272,432 A | 12/1993 | Nguyen et al. | |
| 5,796,276 A * | 8/1998 | Phillips | H03K 17/063 323/315 |
| 7,639,081 B2 | 12/2009 | Arakali et al. | |
| 8,253,479 B2 | 8/2012 | Haddad et al. | |
| 9,722,599 B1 * | 8/2017 | Ivankovic | H03K 17/74 |
| 2010/0207692 A1 * | 8/2010 | Arai | H03F 1/223 330/296 |
| 2011/0115452 A1 * | 5/2011 | Haddad | G05F 3/262 323/273 |
| 2014/0084962 A1 * | 3/2014 | Schuler | H03K 19/00 327/108 |

(Continued)

FOREIGN PATENT DOCUMENTS

WO  WO 83/00397 A1  2/1983

*Primary Examiner* — Lincoln D Donovan
*Assistant Examiner* — Dave Mattison
(74) *Attorney, Agent, or Firm* — Blank Rome LLP (57) ABSTRACT

An enhancement mode GaN FET based gate driver circuit including an active pre-driver to drive a high-slew rate, high current output stage GaN FET. Due to the active driver current from the pre-driver, the output stage pull-up FET can turn on faster as compared to a pre-driver that utilizes a passive pull-up load. The active pre-driver must provide a voltage to drive the gate of the output stage pull-up FET which is higher than the normal supply voltage to enable the maximum output level of the driver FET to approach the normal supply voltage. A feedback circuit is included in the active pre-driver to avoid the need for two supply voltages.

8 Claims, 10 Drawing Sheets

(56) References Cited

U.S. PATENT DOCUMENTS

2016/0079979 A1* 3/2016 Kinzer .................... H01L 23/62
                                                        323/312
2016/0349785 A1* 12/2016 Ciubotaru ................. G05F 1/46
2017/0346475 A1* 11/2017 de Rooij ............... H01L 27/088

* cited by examiner

GAN DRIVER USING ACTIVE PRE-DRIVER WITH FEEDBACK

This application claims the benefit of U.S. Provisional Application No. 62/723,801, filed on Aug. 28, 2018, the entire disclosure of which is hereby incorporated by reference.

BACKGROUND

1. Field of the Invention

The present invention relates generally to enhancement mode GaN FET based drivers using an active pre-driver, and more particularly to an active pre-driver with feedback such that the active pre-driver can operate on the same supply voltage as the gate driver circuit.

2. Description of the Related Art

Typical gate drivers for enhancement mode GaN FETs include a bootstrapping circuit or an active pre-driver with depletion mode FETs to provide an increased voltage to the gate terminal of the high side FET of the output stage of the driver. A bootstrapping gate driver stores energy in capacitors while the associated FET is turned off and uses the stored energy to apply a voltage greater than a supply voltage to the gate terminal of the FET, keeping it turned on despite increases in voltage on a source terminal of the associated FET. An active pre-driver with depletion mode transistors acts as a current source and supplies additional drive current to the gate terminal of the associated FET.

Figure 1A:
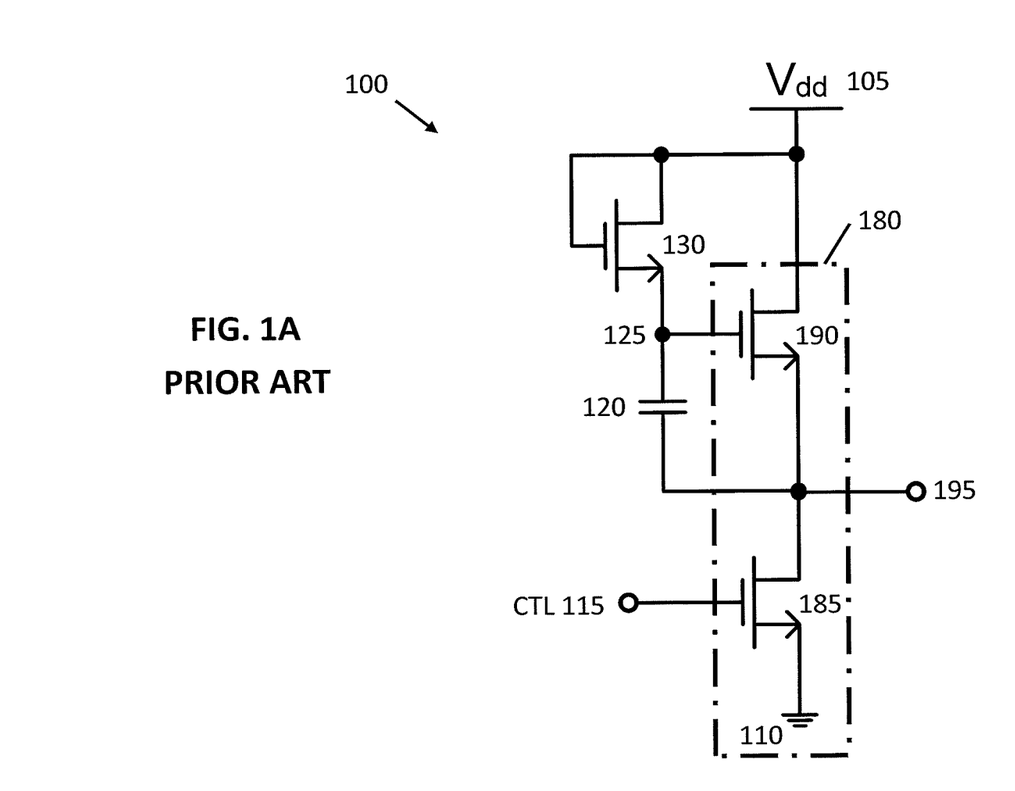
FIGS. 1A-B illustrate schematics of conventional bootstrapping gate drivers.
Figure 1B:
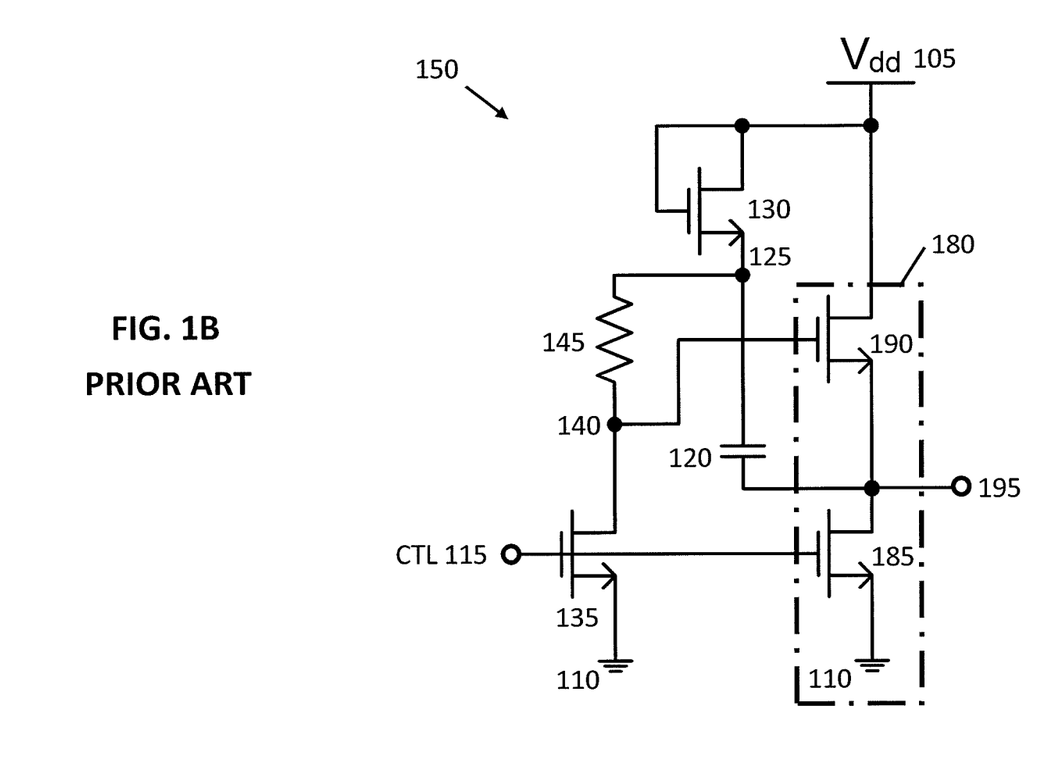

FIGS. 1A-B illustrate schematics of conventional bootstrapping gate drivers. In FIG. 1A, a bootstrapping gate driver 100 includes transistors 130, 185, and 190 and a capacitor 120. Transistors 185 and 190 comprise output stage 180. The gate terminal of transistor 185 receives a control signal CTL 115. In response to CTL 115 being logic low, transistor 185 acts as an open switch, disconnecting output node 195 from ground 110. The voltage at node 125 is the supply voltage $V_{dd}$ minus the gate to source voltage $V_{GS}$ of transistor 130, causing transistor 190 to act as a closed switch and connect output node 195 to supply voltage source 105. As the voltage on output node 195 increases, the voltage across capacitor 120 remains approximately $V_{dd}$ minus the threshold voltage $V_{Th}$ of transistor 130. The voltage on node 125 increases proportional to the increase in the voltage on output node 195, such that the voltage on node 125 increases above $V_{dd}$ and keeps transistor 190 turned on as the voltage on its source terminal increases to approximately $V_{dd}$. Disadvantageously, noise from supply voltage source 105 appears directly in the voltage on output node 195.

In response to CTL 115 being logic high, transistor 185 acts as a closed switch connecting output node 195 to ground node 110 and quickly decreasing the voltage at node 195 to ground. The diode-configured transistor 130 keeps the voltage at node 125 from decreasing below $V_{dd}-V_{GS}$, causing transistor 190 to remain on as a closed switch and conduct current from supply voltage source 105 to ground node 110 through transistor 185. Gate driver 100 thus consumes a large amount of current in response to CTL 115 being logic high, drastically increasing its power consumption.

Turning to FIG. 1B, bootstrapping gate driver 150 is similar to bootstrapping gate driver 100 shown in FIG. 1A, but incorporates an additional transistor 135 and a resistor 145. The gate terminal of transistor 135 receives CTL 115. In response to CTL 115 being logic high, transistor 135 acts as a closed switch connecting node 140 to ground node 110, causing transistor 190 to turn off and act as an open switch and disconnecting output node 195 from supply voltage source 105. Capacitor 120 is charged from supply voltage source 105 via transistors 130 and 135.

In response to CTL 115 being logic low, transistor 135 acts as an open switch, disconnecting node 140 from ground node 110. The initial voltage on node 125 increases the voltage on node 140 through resistor 145. As the voltage on node 140 increases above $V_{Th}$, transistor 190 turns on and acts as a closed switch, connecting output node 195 to supply voltage source 105. The bootstrapping gate driver 150 shown in FIG. 1B advantageously balances static currents during turn-off of transistor 190 with length of the turn-on time using resistor 145. A larger resistance for resistor 145 decreases static current through bootstrapping gate driver 150 in response to CTL 115 being logic high and thus decreases the power consumption of driver 150, but also disadvantageously slows the turn-on of transistor 190 and the corresponding increase in voltage on output node 195 in response to CTL 115 being logic low.

Figure 2A:
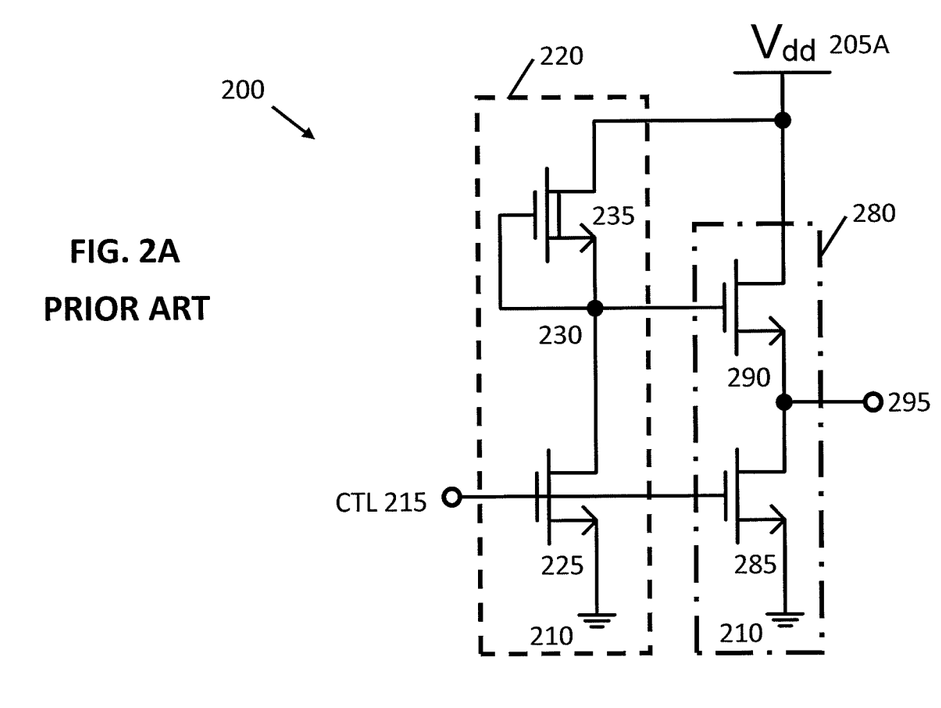
FIGS. 2A-B illustrate schematics of conventional active pre-drivers.
Figure 2B:
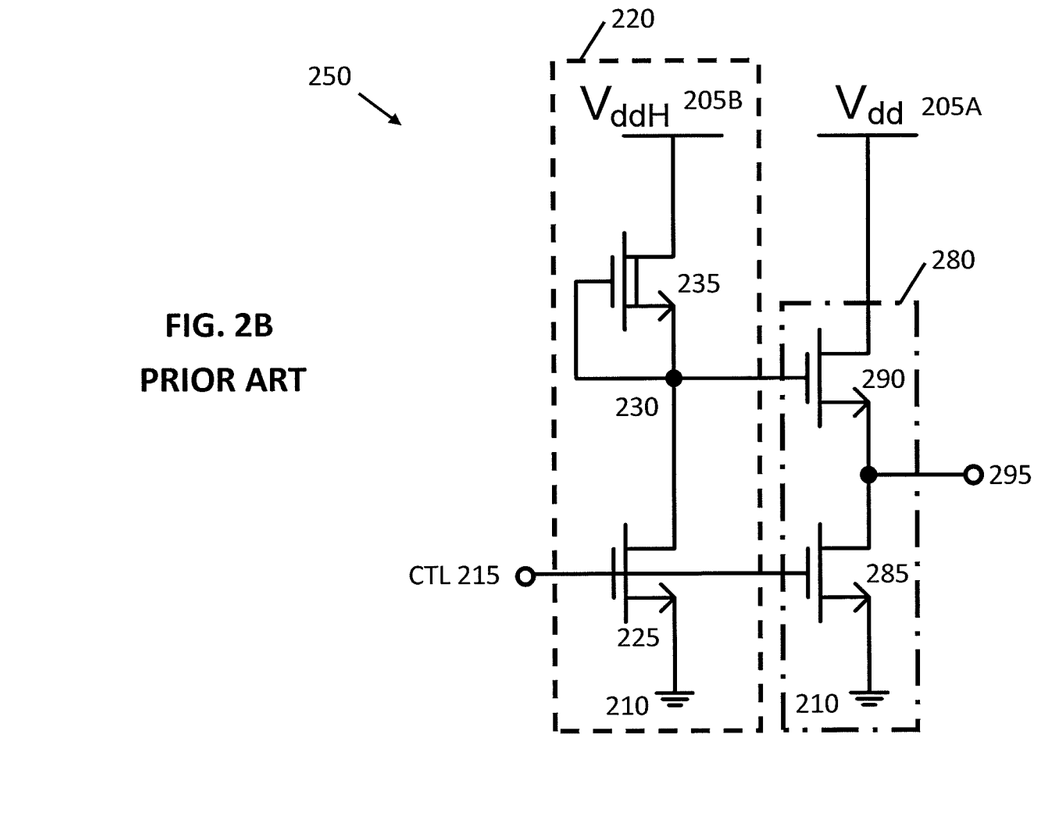

FIGS. 2A-B illustrate schematics of conventional active pre-drivers. In FIG. 2A, active pre-driver 220 includes transistor 225 and depletion mode transistor 235. Transistors 285 and 290 comprise output stage 280 of the driver circuit 200, similar to output stage 180 shown in FIGS. 1A-B. The gate terminal of transistor 225 receives control signal CTL 215, and the source terminal of transistor 225 is connected to ground 210. Depletion mode transistor 235 acts like a current source and provides a sufficiently large current to pull up the voltage on node 230 and keep transistor 290 turned on as the voltage on its source terminal increases.

In response to CTL 215 being logic high, transistors 225 and 285 act as closed switches. Transistor 225 connects node 230 to ground node 210, decreasing the voltage on node 230 and causing transistor 290 to turn off and act as an open switch. Depletion mode transistor 235 remains on and generates current which flows through transistor 225 to ground 210, causing active pre-driver 200 to consume static current. Transistor 285 connects output node 295 to ground node 210, quickly decreasing the voltage on output node 295 to ground. In response to CTL 215 being logic low, transistors 225 and 285 act as open switches, disconnecting node 230 and output node 295 from ground node 210. The voltage on node 230 increases above the threshold voltage $V_{Th}$ of transistor 290 and turns it on. Transistor 290 acts as a closed switch and connects output node 295 to supply voltage source 205A. The voltage on output node 295 increases to approximately $V_{dd}-V_{Th}$, but cannot increase further, to $V_{dd}$.

In FIG. 2B, active pre-driver 220 is similar to the active pre-driver shown in FIG. 2A, but pre-driver 220 of FIG. 2B is connected to a second supply voltage source 205B, which provides a supply voltage $V_{ddH}$ that is greater than $V_{dd}$ from supply voltage source 205A. The higher supply voltage allows the voltage on node 230 to be greater than $V_{dd}+V_{Th}$, which allows the voltage on output node 295 to increase to approximately $V_{dd}$. However, the addition of a second supply voltage source 205B increases the area of the semiconductor die taken up by driver circuit 200 and increases the complexity of the integrated circuit, requiring higher pin counts, more external bypass capacitors, external circuits to generate the second supply voltage source 205B, electrostatic discharge circuits and pads, and the like.

SUMMARY OF THE INVENTION

The present invention addresses the disadvantages of conventional bootstrapping gate drivers and active pre-drivers, discussed above, by providing an active pre-driver with feedback. The active pre-driver of the present invention turns on the output stage pull-up FET more quickly than a pre-driver with a passive pull-up load, and the feedback circuit of the present invention allows the driver circuit to operate on a single, higher supply voltage, while limiting the maximum output voltage of the driver.

More specifically, the active pre-driver of the present invention comprises an output stage for driving the pull-up transistor of the gate driver output stage, a current source connected to the single supply voltage for generating a voltage to drive the output stage of the active pre-driver, and a feedback circuit connected to the output voltage of the active pre-driver and drawing a feedback current from the current source.

The feedback circuit is configured to maintain a particular voltage on the output node, such that the gate driver can operate on a higher supply voltage but maintain a lower voltage on the output node and protect a load from the higher supply voltage. When a second output stage is connected to the output node, the second output stage can be connected to the supply voltage node and the feedback circuit maintains the particular gate voltage needed to keep the transistor turned on as the voltage on its source terminal increases. By operating on a single supply voltage, the complexity and area taken by the gate driver is reduced. In a further embodiment, the feedback circuit comprises a cascode current mirror.

In another embodiment, the current source comprises a resistor connected to the first node and the supply voltage node. In yet another embodiment, the current source comprises a depletion mode GaN FET.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 3:
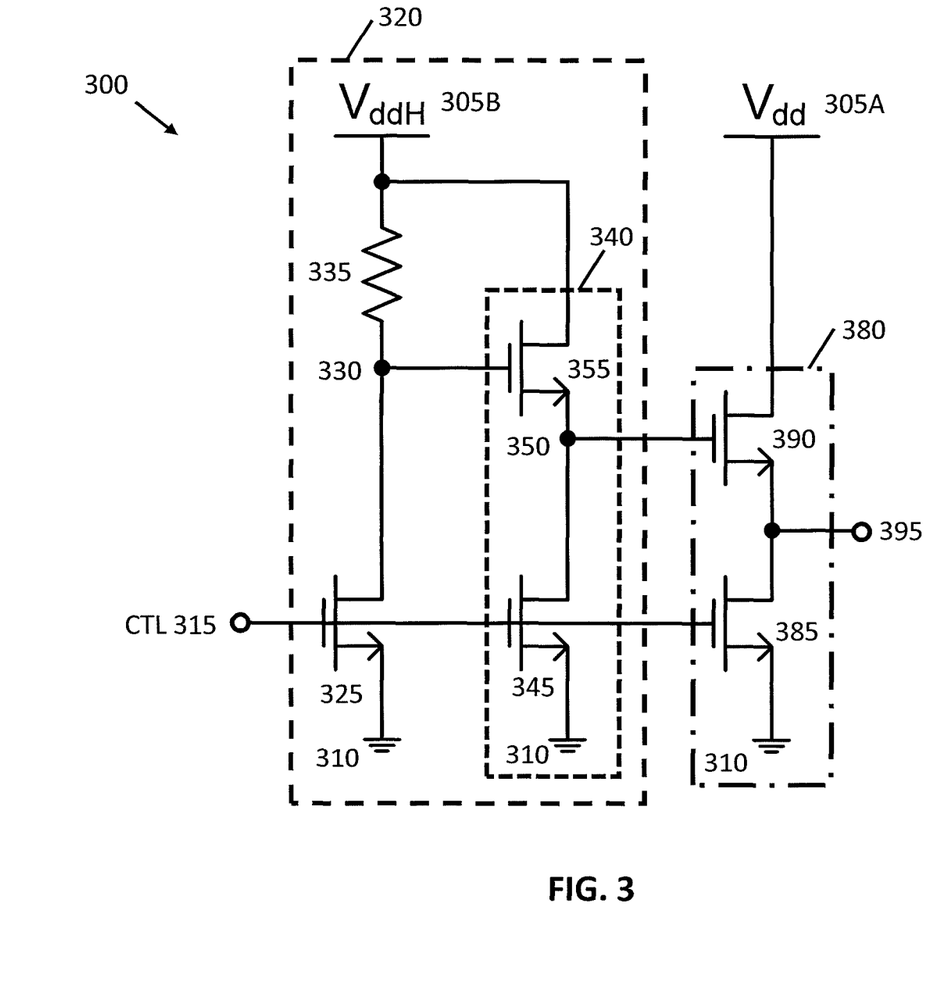
FIG. 3 illustrates an active pre-driver according to a first embodiment of the present invention.

FIG. 3 illustrates a gate driver with an active pre-driver according to a first embodiment of the present invention. Gate driver 300 includes an active pre-driver circuit 320 and an output stage 380, which comprises transistors 385 and 390, similar to output stage 180 and transistors 185 and 190 shown in FIGS. 1A-B. Active pre-driver circuit 320 includes transistors 325, 345, and 355, and resistor 335. Transistors 345 and 355 comprise the output stage 340 for active pre-driver circuit 320, similar to output stage 380 for gate driver 300. Transistors 390, 385, 325, 345, and 355 are preferably enhancement mode GaN FET semiconductor devices, which are monolithically integrated with the other components of gate driver 300 onto a single semiconductor die. Because GaN FETs are able to carry large currents, support high voltages, and switch more quickly than conventional transistors, gate driver 300 is able to increase and decrease the voltage on output node 395 more quickly than a similar system implementing other transistors, such as MOSFETs. Thus, gate driver 300, with active pre-driver circuit 320, can drive a high slew rate, high current GaN FET.

Output stage 380 of gate driver 300 is connected to a first supply voltage source 305A, which provides a supply voltage $V_{dd}$. In active pre-driver circuit 320, the gate terminal of transistor 325 receives CTL 315, and the source terminal of transistor 325 is connected to ground 310. The drain terminal of transistor 325 is connected to resistor 335 and the gate terminal of transistor 355 in output stage 340 at node 330. In some implementations, a second resistor is connected between the drain terminal of transistor 325 and node 330 and has a resistance such that the voltage drop across the second resistor is less than $V_{Th}$ in response to CTL 315 being logic high, keeping transistor 350 turned off. Resistor 335 is further connected to a second supply voltage source 305B, which provides a supply voltage $V_{ddH}$ that is greater than $V_{dd}$ from supply voltage source 305A. Resistor 335 functions as a current source for gate driver 300, as $V_{ddH}$ from supply voltage source 305B is applied to resistor 335 and current flows through resistor 335. In other embodiments, resistor 335 can be replaced by a depletion mode transistor which acts as a current source.

The gate terminal of transistor 345 receives CTL 315, and the source terminal of transistor 345 is connected to ground 310. The drain terminal of transistor 345 is connected to the source terminal of transistor 355 and the gate terminal of transistor 390 in output stage 380 at node 350. The drain terminal of transistor 355 is connected to the second supply voltage source 305B. Transistor 355 is an active pull-up FET and is smaller than transistor 390. Because transistor 355 is smaller, it turns on more quickly through resistor 335 and consumes less overall current than a pre-driver with a constant current load or a resistive load. Furthermore, resistor 335 can be larger to reduce static current through active pre-driver circuit 320 in response to CTL 315 being logic high.

In response to CTL 315 being logic high, transistors 325, 345, and 385 act as closed switches, connecting nodes 330, 350, and 395 to ground 310, respectively. The voltage on output node 395 quickly decreases to ground. The voltage on node 350 quickly decreases to ground as well, turning off transistor 390 and disconnecting supply voltage source 305A from output node 395. The voltage on node 330 quickly decreases to ground as well, turning off transistor 350. Current flows only through resistor 335, which has a resistance chosen to reduce current flow in response to CTL 315 being logic high and reduces the power consumption of gate driver 300.

In response to CTL 315 being logic low, transistors 325, 345, and 385 act as open switches, disconnecting nodes 330, 350, and 395 from ground node 310, respectively. The voltage on node 330 increases above the threshold voltage $V_{Th}$ of transistor 355, turning it on. Transistor 355, acting as a source follower, increases the voltage on node 350 until the voltage on node 330 is approximately equal to the supply voltage $V_{ddH}$ and the voltage on node 350 is approximately equal to $V_{ddH}-V_{Th}$, due to the threshold voltage drop across transistor 355. The increasing voltage on node 350 turns on transistor 390, which connects supply voltage source 305A to output node 395. For $V_{ddH}$ greater than $V_{dd}+2V_{Th}$, the voltage on node 350 is greater than $V_{dd}+V_{Th}$, which keeps transistor 390 turned on as the voltage on its source terminal increases to approximately $V_{dd}$. The voltage on output node 395 reaches $V_{dd}$, although gate driver 300 uses two supply voltages and has the increased area and complexity associated with multiple supply voltages.

Figure 4:
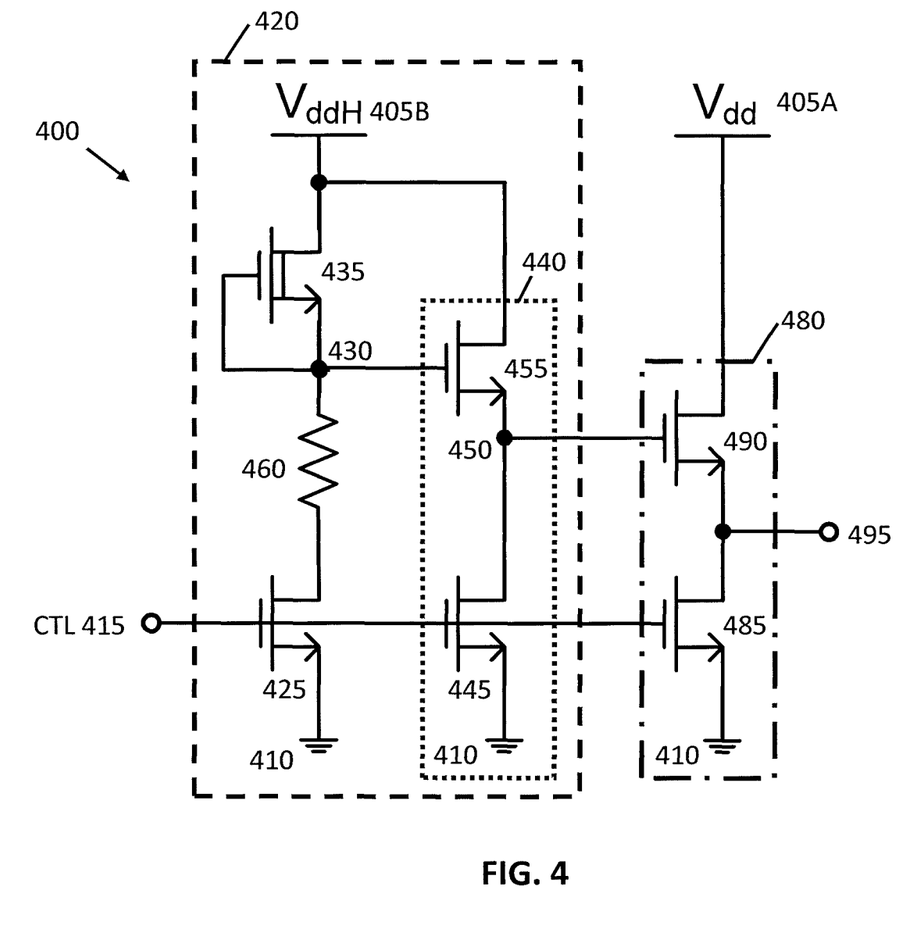
FIG. 4 illustrates an active pre-driver according to a variation of the first embodiment of the present invention.

FIG. 4 illustrates a gate driver with an active pre-driver according to a variation of the first embodiment of the present invention. Gate driver 400 is similar to gate driver 300 shown in FIG. 3, but active pre-driver circuit 420 includes a depletion mode transistor 435, instead of resistor 335, and a resistor 460. In active pre-driver circuit 420, the drain terminal of transistor 425 is connected to resistor 460, which is further connected to the gate terminal of transistor 455 and the gate terminal and the source terminal of depletion mode transistor 435 at node 430. The drain terminal of depletion mode transistor 435 is connected to the second supply voltage source 405B. Depletion mode transistor 435 acts like a current source.

In response to CTL 415 being logic high, transistors 425, 445, and 485 act as closed switches, connecting resistor 460 and nodes 450 and 495 to ground 410, respectively. Current from depletion mode transistor 435 flows only through resistor 460, reducing the current consumption of gate driver 400. Resistor 460 has a resistance chosen to reduce current flow but also ensure the voltage drop across resistor 460 is less than $V_{Th}$ in response to CTL 415 being logic high, keeping transistor 455 turned off.

Figure 5:
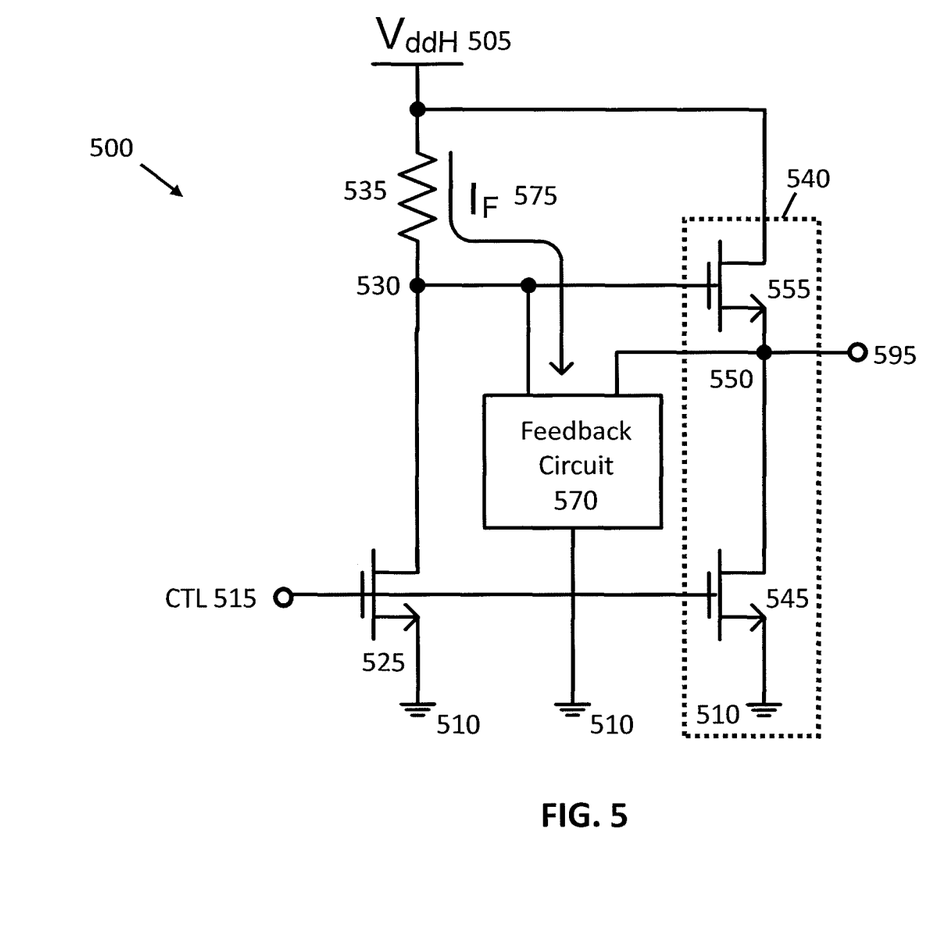
FIG. 5 illustrates an active pre-driver with closed loop feedback according to a second embodiment of the present invention.

FIG. 5 illustrates a gate driver with an active pre-driver having closed loop feedback according to a second embodiment of the present invention. The active pre-driver of gate driver circuit 500 is similar to active pre-driver 320 shown in FIG. 3, but includes a feedback circuit 570 connected to nodes 530 and 550. Feedback circuit 570 is configured to keep the voltage on node 550 within a predetermined range of voltages centered around the desired voltage for node 550. In response to the voltage on node 550 exceeding above the predetermined range, feedback circuit 570 generates a feedback current $I_F$ 575, causing a voltage drop across resistor 535 and reducing the gate voltage of transistor 555. As a result, the voltage on the source terminal of transistor 555, i.e. the voltage at node 550 and output node 595, is decreased to be within the predetermined range. Feedback circuit 570 enables gate driver 500 to operate on a single, higher supply voltage by maintaining a lower, desired voltage on output node 595 and acting as the second supply voltage source. For example, $V_{ddH}$ is 12 volts (V), and feedback circuit 570 maintains a lower desired voltage $V_{dd}$ equal to 5V.

Gate driver 500 can be used directly as a driver for capacitive loads. In some embodiments, an additional resistor is connected between the drain terminal of transistor 525 and node 530 to reduce static current through the active pre-driver and its overall power consumption. The resistance of the additional resistor is chosen such that the voltage drop across it is less than $V_{Th}$ in response to CTL 515 being logic high, keeping transistor 555 turned off. In some embodiments, the active pre-driver includes a depletion mode transistor which acts like a current source, instead of resistor 535. The drain terminal of the depletion mode transistor is connected to the supply voltage source 505, and the gate and source terminals of the depletion mode transistor are connected together at node 530.

Figure 6A:
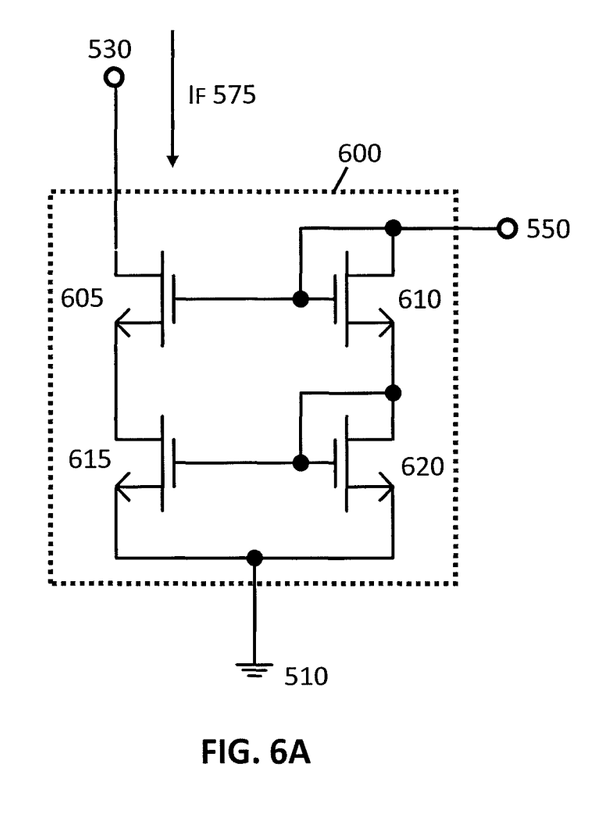
FIGS. 6A-B illustrate two closed loop feedback circuits for an active pre-driver according to the second embodiment of the present invention.
Figure 6B:
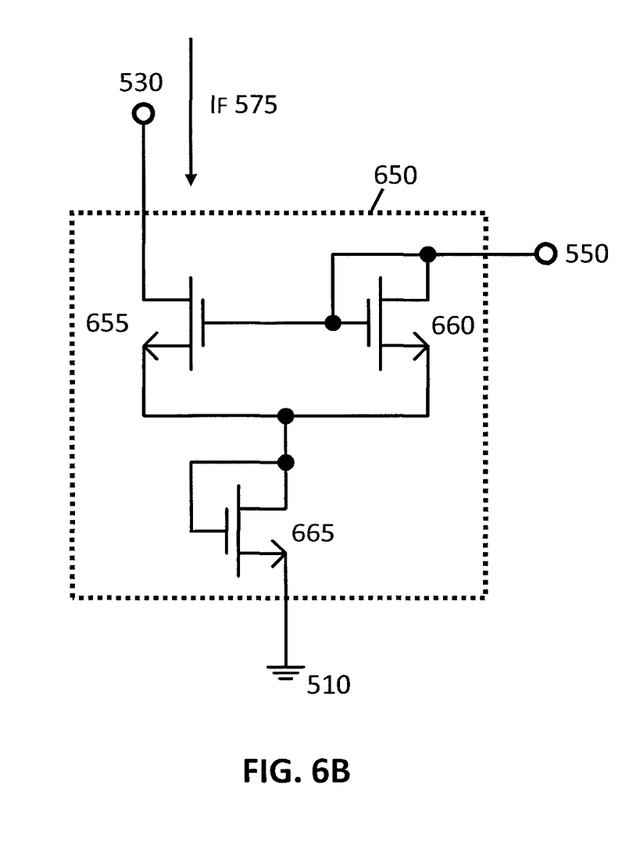

FIGS. 6A-B illustrate two closed loop feedback circuits for an active pre-driver according to the second embodiment of the present invention. In FIG. 6A, feedback circuit 600 comprises a cascode current mirror formed of transistors 605, 610, 615, and 620. The drain and gate terminals of transistor 610 and the gate terminal of transistor 605 are connected together at node 550. The source terminal of transistor 610 is connected to the gate and drain terminals of transistor 620 and the gate terminal of transistor 615. The source terminals of transistors 615 and 620 are connected to ground 510. The drain terminal of transistor 615 is connected to the source terminal of transistor 605. The drain terminal of transistor 605 is connected to node 530.

The voltage that feedback circuit 600 maintains on node 550 is based on the sizes of transistors 555, 605, 610, 615, and 620 and the resistance of resistor 535. For feedback circuit 600 as shown in FIG. 6A, which includes one cascode FET 610, the desired voltage is equal to the threshold voltages $V_{Th}$ and the overdrive voltages $V_{OV}$ of transistors 610 and 620. For N cascode FETs connected together, the desired voltage is equal to $(N+1)(V_{Th}+V_{OV})$. The settling time for the voltage on node 550 is determined by the response time of feedback circuit 600. Shorter settling times correspond to less overshoot voltage above the desired voltage and faster cascode current mirrors.

In FIG. 6B, feedback circuit 650 comprises a simple current mirror formed of transistors 655, 660, and a diode-configured transistor 665. The drain and gate terminals of transistor 660 and the gate terminal of transistor 655 are connected together at node 550. The source terminal of transistor 660 and the source terminal of transistor 655 are connected together and to the drain and gate terminals of transistor 665. The source terminal of transistor 665 is connected to ground 510, and transistor 665 is configured as a diode. The drain terminal of transistor 655 is connected to node 530. The voltage that feedback circuit 650 maintains on node 550 is adjusted by adding more transistors configured as diodes below the simple current mirror of transistors 655 and 660.

For feedback circuit 650 shown in FIG. 6B, which includes one transistor 665 configured as a diode, the desired voltage is equal to the threshold voltages $V_{Th}$ and the overdrive voltages $V_{OV}$ of transistors 660 and 665, similar to feedback circuit 600 shown in FIG. 6A. For N diodes or transistors configured as diodes and connected to transistors 655 and 660, the desired voltage is equal to $(N+1)(V_{Th}+V_{OV})$. Unlike feedback circuit 600 though, two currents charge transistor 665 above its threshold voltage: the current through transistor 655 and the current through transistor 660. The two currents turn transistor 665 on more quickly than the single current through transistor 610 in feedback circuit 600 can turn on transistor 620. Thus, feedback circuit 650 has a shorter settling time than feedback circuit 600, and less overshoot voltage on node 550.

Figure 7:
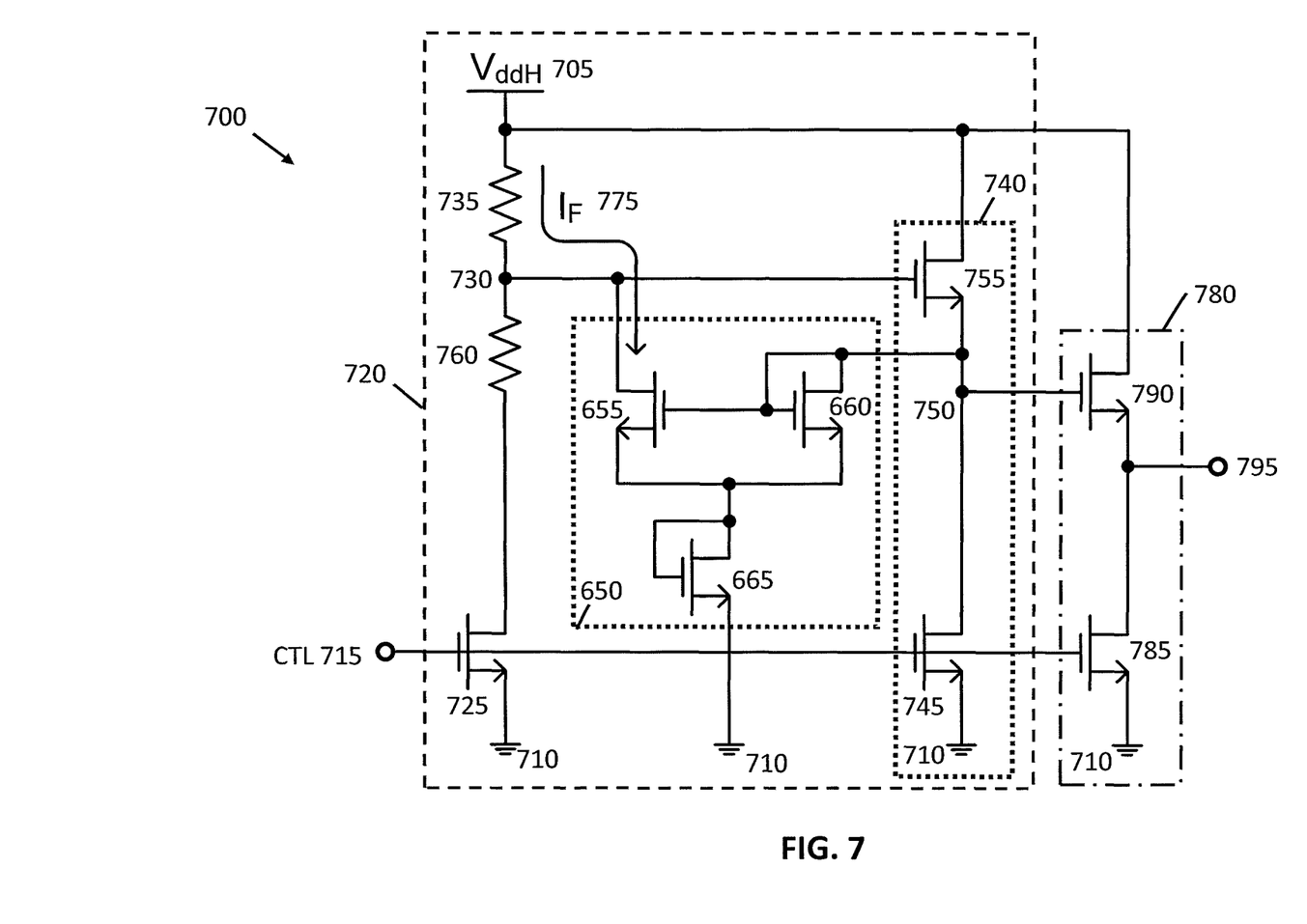
FIG. 7 illustrates an active pre-driver with closed loop feedback and an output stage, according to a third embodiment of the present invention.

FIG. 7 illustrates a gate driver circuit 700 with an active pre-driver with closed loop feedback and an output stage, according to a third embodiment of the present invention. Gate driver 700 includes an active pre-driver circuit 720 and an output stage 780, which comprises transistors 785 and 790, similar to output stage 180 and transistors 185 and 190 shown in FIG. 1A. Output stage 780 is connected to supply voltage source 705, which provides a higher supply voltage $V_{ddH}$. Active pre-driver circuit 720 includes transistors 725, 745, and 755, resistors 735 and 760, and feedback circuit 650 shown in FIG. 6B. Transistors 745 and 755 comprise an output stage 740 for active pre-driver circuit 720, similar to output stage 780 for gate driver 700.

In active pre-driver circuit 720, resistor 760 is chosen to have a resistance such that the voltage drop across resistor 760 is less than $V_{Th}$ in response to CTL 715 being logic high, keeping transistor 750 turned off. In some embodiments, resistor 760 is omitted, and higher static currents are experienced. In some embodiments, a depletion mode transistor which acts like a current source is substituted for resistor 735. The drain terminal of the depletion mode transistor is connected to the supply voltage source 705, and the gate and source terminals of the depletion mode transistor are connected together at node 730.

Feedback circuit 650 includes transistors 655, 660, and 665 and is discussed herein with reference to FIG. 6B. In contrast to gate driver 300 shown in FIG. 3, gate driver 700 operates from a single supply voltage source 705 and a single supply voltage $V_{ddH}$, and avoids the increased area and complexity associated with multiple supply voltages. To set a maximum voltage on output node 795 at $V_{dd}$, such as the voltage supplied by supply voltage source 305A shown in FIG. 3, feedback circuit 650 is configured to maintain a desired voltage on node 750 approximately equal to $V_{dd}+V_{th}$.

Gate driver 700 includes output stage 780 to isolate feedback circuit 650 from output node 795. If feedback circuit 650 were connected directly to output node 795, transistor 660 would be increased in size to withstand the greater currents through transistor 790 to output node 795, which would also increase the static current through feedback circuit 650 and increase the current consumption of gate driver 700. Transistor 755 acts as a source follower and reduces the current transistor 660 must be able to withstand, also reducing its size and the static current through feedback circuit 650. For a capacitive load connected to output node 795 and in response to the voltage on output node 795 being $V_{dd}$, transistor 790 turns off and acts as an open switch, disconnecting output node 795 from supply voltage source 705 and isolating the voltage on output node 795 from noise in $V_{ddH}$.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A gate driver using an active pre-driver with feedback which operates on a single supply voltage, the gate driver comprising the active pre-driver with feedback and a gate driver output stage having a pull-up transistor, the active pre-driver comprising:
    a pre-driver output stage comprising an active pull-up transistor for driving the pull-up transistor of the gate driver output stage, the active pull-up transistor switching between two states to provide an active pre-driver output voltage that switches between a desired voltage level and ground, wherein the desired voltage level is less than the supply voltage;
    a current source connected to the single supply voltage for generating a voltage to drive the output stage of the active pre-driver; and
    a feedback circuit connected to the output voltage of the active pre-driver and drawing a feedback current from the current source to maintain the output voltage of the active pre-driver within a predetermined range of the desired voltage level when the active pre-driver output voltage switches to the desired voltage level.

2. The gate driver of claim 1, wherein the output stage of the active pre-driver comprises:
    a first gallium nitride (GaN) field effect transistor (FET) having a gate terminal connected to the current source, a drain terminal connected to the single supply voltage, and a source terminal connected to the feedback circuit and to a gate terminal of the pull-up transistor of the gate driver output stage, and
    a second GaN FET having a gate terminal connected to a control input, a drain terminal connected to the feedback circuit and the gate terminal of the pull-up transistor, and a source terminal connected to ground.

3. The gate driver of claim 2, wherein the output stage of the gate driver comprises:
    the pull-up transistor, which comprises a high-slew rate, high current GaN FET having a drain terminal connected to the single supply voltage, and a source terminal connected to the output of the gate driver, and
    a further GaN FET having a gate terminal connected to the control input, a drain terminal connected to the output of the gate driver, and a source terminal connected to ground.

4. The gate driver of claim 1, wherein the current source comprises a resistor connected at one side to the single supply voltage and connected at the other side to the output stage of the active pre-driver.

5. The gate driver of claim 1, wherein the current source comprises a depletion mode GaN FET having a drain terminal connected to the single supply voltage, and a gate terminal and a source terminal connected together and to the output stage of the active pre-driver.

6. The gate driver of claim 1, wherein the feedback circuit comprises a current mirror.

7. The gate driver of claim 1, wherein the feedback circuit comprises a cascode current mirror.

8. The gate driver of claim 1, wherein the active pull-up transistor of the active pre-driver is smaller than the pull-up transistor of the gate driver output stage.

* * * * *